United States Patent [19]

Schuppert, Jr. et al.

[11] Patent Number: 4,718,162
[45] Date of Patent: Jan. 12, 1988

[54] WORKPIECE INSERTION DEPTH ADJUSTMENT MEANS

[75] Inventors: Leo V. Schuppert, Jr., York; Richard V. Spong, Etters, both of Pa.

[73] Assignee: AMP Incorporated, Harrisburg, Pa.

[21] Appl. No.: 898,166

[22] Filed: Aug. 18, 1986

[51] Int. Cl.⁴ .................................................. H05K 13/04
[52] U.S. Cl. ........................................ 29/741; 29/718; 29/739; 74/57
[58] Field of Search ............... 29/709, 741, 718, 739; 74/54, 57, 568, 838

[56] References Cited

U.S. PATENT DOCUMENTS 4,570,500  2/1986  Richter ............................ 74/57 X
4,612,700  9/1986  Loomis et al. ................... 29/741 X

*Primary Examiner*—P. W. Echols
*Assistant Examiner*—Taylor J. Ross
*Attorney, Agent, or Firm*—Thomas G. Terrell

[57] ABSTRACT

Apparatus for inserting components into a workpiece comprises a rotary disc cam having first and second communicating endless superposed, cam tracks for receiving a cam follower connected to a tool holder carrying a component insertion tool. Rotation of the disc cam drives to the tool through a component inserting stroke and a return stroke. Over tool driving lobes thereof, the cam tracks are offset from each other radially of the axis of rotation of the disc cam. The cam follower is carried by a slide in the tool holder, the slide being connected to a drive unit which is actuable selectively to move the slide between a first position in which the cam follower is engaged in one of the cam tracks and a second position in which it is engaged in the other. By virtue of the offset of the cam tracks, the component is inserted more deeply into workpiece in the second position of the slide than in the first.

9 Claims, 11 Drawing Figures

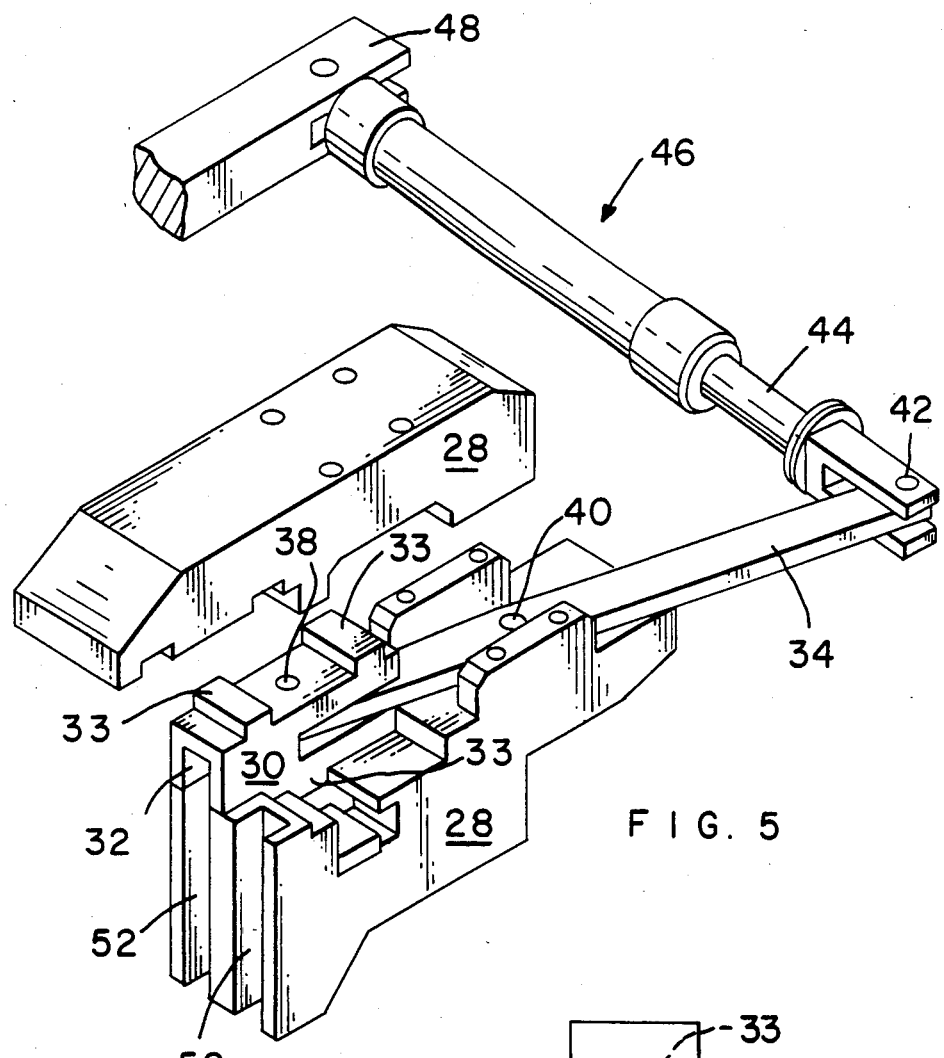
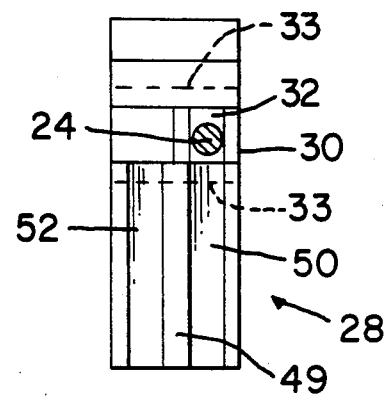
FIG. 5
FIG. 6

WORKPIECE INSERTION DEPTH ADJUSTMENT MEANS

This invention relates to apparatus for inserting a component into a workpiece by means of an insertion tool driven there towards by a rotary cam having a cam track receiving a cam track follower connected to the tool; and having means for adjusting the depth to which the component is inserted into the workpiece.

Such apparatus are described in U.S. Pat. No. 4,612,700, which is incorporated herein by reference. The said application concerns an improvement in apparatus described in U.S. Pat. No. 4,551,901 which is also incorporated herein by reference; whereby the apparatus is adapted to select for insertion in a workpiece, one of four differing components, two of which differ in respect of the depth to which they are required to be inserted into the workpiece. The apparatus of U.S. Pat. No. 4,612,700 is provided with means for adjusting the depth to which the component is to be inserted into the workpiece, such means comprising a toggle linkage connected between the cam follower and the insertion tool, and being movable between a straightened and a broken position in order to adjust the insertion depth. It has been found, however, that since the two insertion depths may vary by only a very small fraction of an inch, for example by only 0.030 inches, greater accuracy in the insertion depth adjustment than can be obtained by means of such a toggle linkage, is desirable.

According to the present invention, the insertion depth adjustment means comprises a second cam track formed in the rotary cam at a deeper level therein than the first cam track and communicating with the first cam track. The second cam track has a tool driving lobe which is displaced from that of the first cam track radially of the axis of rotation of the cam, a mechanism said first or said second cam track as required, thereby to adjust the insertion depth of the workpiece.

Since the difference between the insertion depths is determined by the maximum radial displacement between the cam tracks at the crests of the lobes, finer tolerances in insertion depth than can be achieved by means of the toggle linkage can be achieved by accurate formation of the cam tracks.

The said mechanism may comprise a first slide upon which the cam follower is mounted and which is disposed in a slideway in a holder for the insertion tool, for movement towards and away from the cam, to locate the cam follower in a desired one of the cam tracks.

The first slide may be operated by a second slide connected to the first slide by a projection thereon which extends into a groove in the second slide, the second slide being movable towards and away from the cam and being contained in a housing which is fixed to a frame of the apparatus and which has a pair of juxtaposed channels each of which is aligned with the groove in the second slide in one of two positions of adjustment thereof. The channels in the housing extend in the direction of movement of the insertion tool, so as to allow for the movement of the tool holder during working and return strokes of the tool.

The second slide may be operated by means of a lever connected to a driving device which is controlled by a microprocessor for controlling the operation of the insertion apparatus. Means are preferably provided for sensing the positions of the slides thereby to inform the microprocessor of the insertion depth to which the insertion depth selecting means has been set.

For a better understanding of the invention, reference will now be made by way of example to the accompanying drawings in which:

FIG. 5 is a fragmentary, partially exploded, perspective view illustrating a detail of said adjusting means;

FIG. 6 is a view taken on the lines 6—6 of FIG. 2;

Excepting for said insertion depth adjusting means, the component insertion apparatus is substantially the same as that described in patent application Ser. No. 727,708, mentioned above. Only those parts of the apparatus which are necessary for the proper understanding of the present invention, will therefore be described here.

Figure 1:
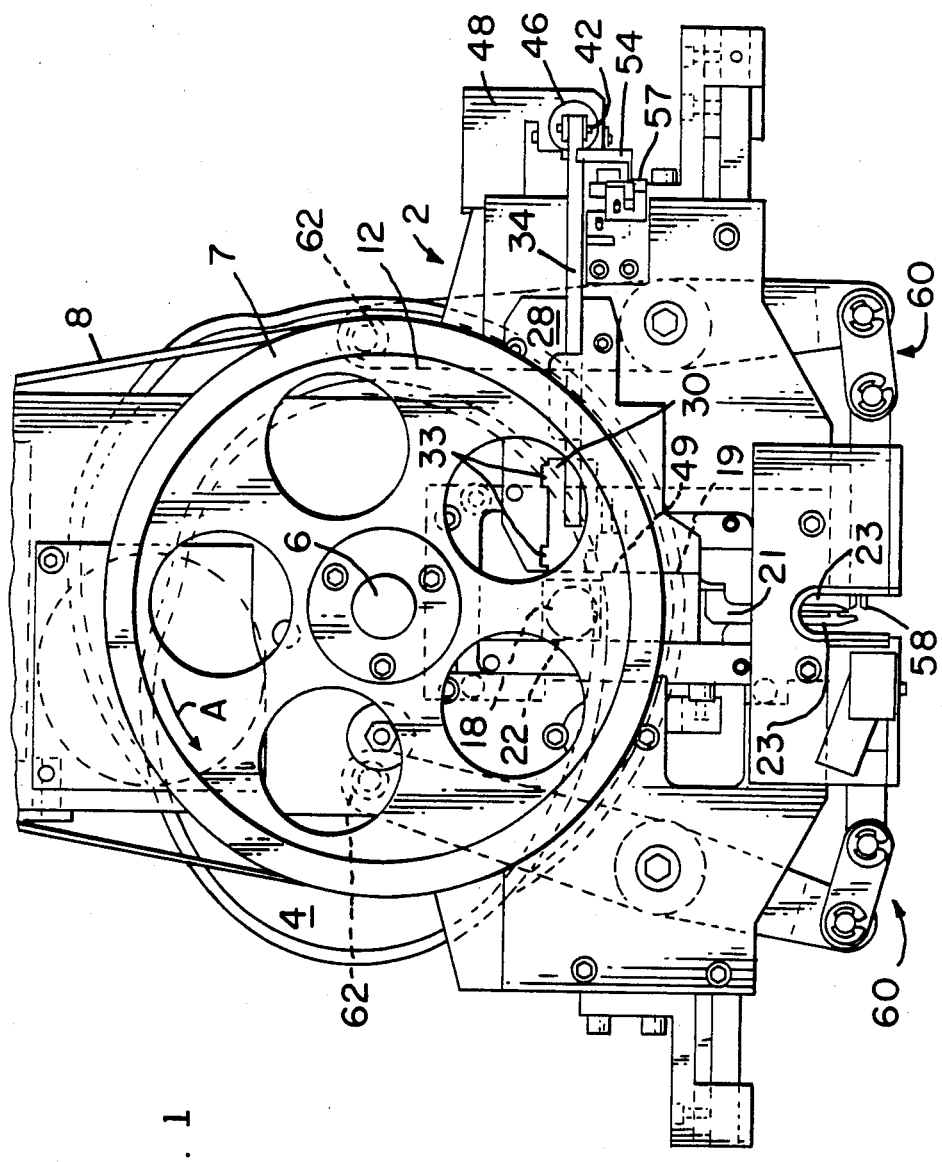
FIG. 1 is a front view of apparatus, with parts removed, for inserting a component into a workpiece and comprising means for adjusting the depth to which the component is to be inserted into the workpiece.

The apparatus comprises a frame 2 in which is rotatably mounted a disc cam 4 on a horizontal shaft 6 and which is arranged to be rotated about the axis of the shaft 6 by means of an electric motor (not shown), through a drive wheel 7 and a drive belt 8 (FIG. 1). The cam 4 has formed therein a first endless cam track 10 opening into the forward surface 12 of the cam 4 and communicating with a second endless cam track 14 which lies inwardly of the surface 12 that is to say rearwardly, with respect to the cam track 10, the tracks 10 and 14 accordingly being in superposed relationship. The tracks 10 and 14 are radially offset along tool driving lobes 11 thereof, in relation to the shaft 6, but are in alignment over the remainder 15 of their length, the maximum offset of the tracks 10 and 14 occurring at the crests 13 of the lobes 11.

Figure 3:
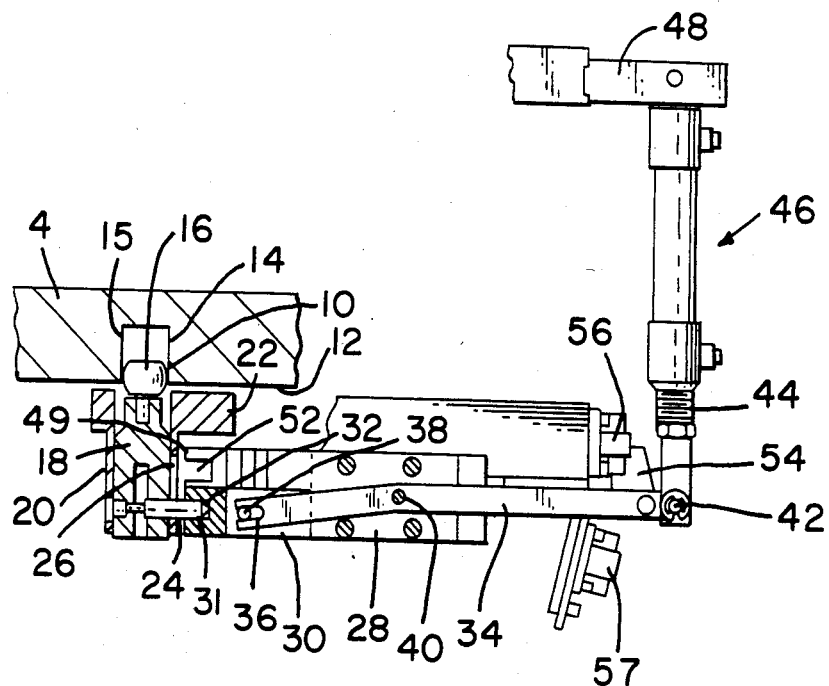
FIG. 3 is a view taken on the lines 3—3 of FIG. 2, illustrating a first mode of operation of the insertion depth adjusting means.
Figure 4:
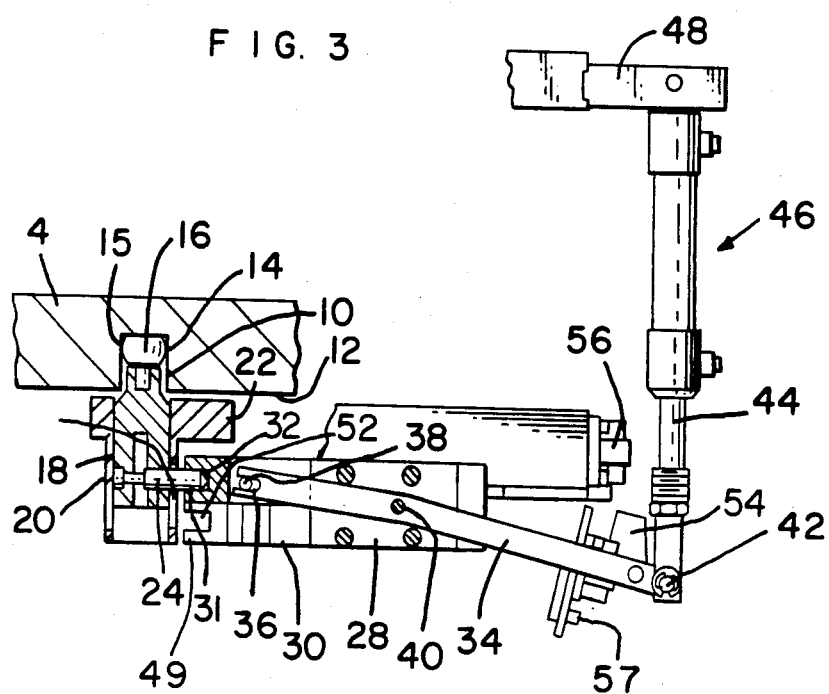
FIG. 4 is a similar view to that of FIG. 3 but illustrating a second mode of operation of said adjusting means.

A cam follower roller 16 which is engageable in either of the cam tracks 10 or 14, as required, is rotatably mounted on a slide 18, which is moveable towards and away from the cam 4 along a horizontal slideway 20 in the upper end part of a tool holder 22, the slideway 20 being aligned with the track 10 and extending normally of the cam 4. The tool holder 22 is mounted for vertical reciprocating movement in a slideway 19 secured to the frame 2. A spigot 24 projects laterally from the slide 18 through a horizontal slot 26 in the tool holder 22 to the lower end of which a component insertion tool 21 is attached. The tool 21 has jaws 23 arranged to be opened and to be closed about a component by means of a mechanism 25, according to the teaching of U.S. Pat. No. 4,551,901 and U.S. Pat. No. 4,612,700, cited above. A housing 28 secured to the frame 2 has mounted therein, for horizontal sliding movement towards and away from the cam 4, a slide 30 formed with a groove 32 opening towards the slide 18 and receiving the free end portion 31 of the spigot 24. The slide 30 has splines 33 engaged slidably in grooves in the housing 28, and is movable relative to the housing 28 between a first position remote from the cam 4, in which the slide 30 is shown in FIG. 3, and a second position proximate to the cam 4, in which the slide 30 is shown in FIG. 4, by means of a lever 34 having at one end a slot 36 receiving a pin 38 projecting vertically from the slide 30. The lever 34 is pivotally attached to the housing 28, at 40, intermediate the ends of the lever 34, the other end of the lever 34 being pivotally attached, at 42, to the piston rod 44 of a pneumatic piston and cylinder unit 46 secured to a bracket 48 on the frame 2.

As best seen in FIG. 6, the housing 28 has, formed in its end 49 adjacent to the tool holder 22, a pair of parallel, juxtaposed, vertical channels 50 and 52, the groove 32 in the slide 30 being aligned with the channel 50 in the FIGS. 3 and 6 position of the slide 30, i.e. said first position, and with the channel 52 in the FIG. 4 position thereof, i.e. said second position. A sensing plate 54 is provided on the lever 34 adjacent to the piston rod 44 for cooperation with sensors 56 and 57 on the frame 2 to sense the position of the piston rod 44.

As described in U.S. Pat. No. 4,612,700 mentioned above, the insertion apparatus is arranged for the insertion of electrical pins connected together in parallel relationship by means of a carrier strip, into holes in a printed circuit board. The apparatus is accordingly provided with tools 58, only one of which is shown (FIG. 1) for severing the pins from the strip for insertion into said holes by the tool 21. The tools 58 are connected by linkages 60 to cam followers 62 which ride in further cam tracks (not shown) on the rearward face of the disc cam 4.

The apparatus also comprises, means (not shown) for feeding a plurality of different kinds of strip form pins to the tools 21 and 58 for insertion into the circuit board. The pins of two of these strips differ from one another to the extent that they need to be inserted to different depths, such insertion depths differing by a small fraction of an inch, for example, by 0.030 inches.

Figure 2:
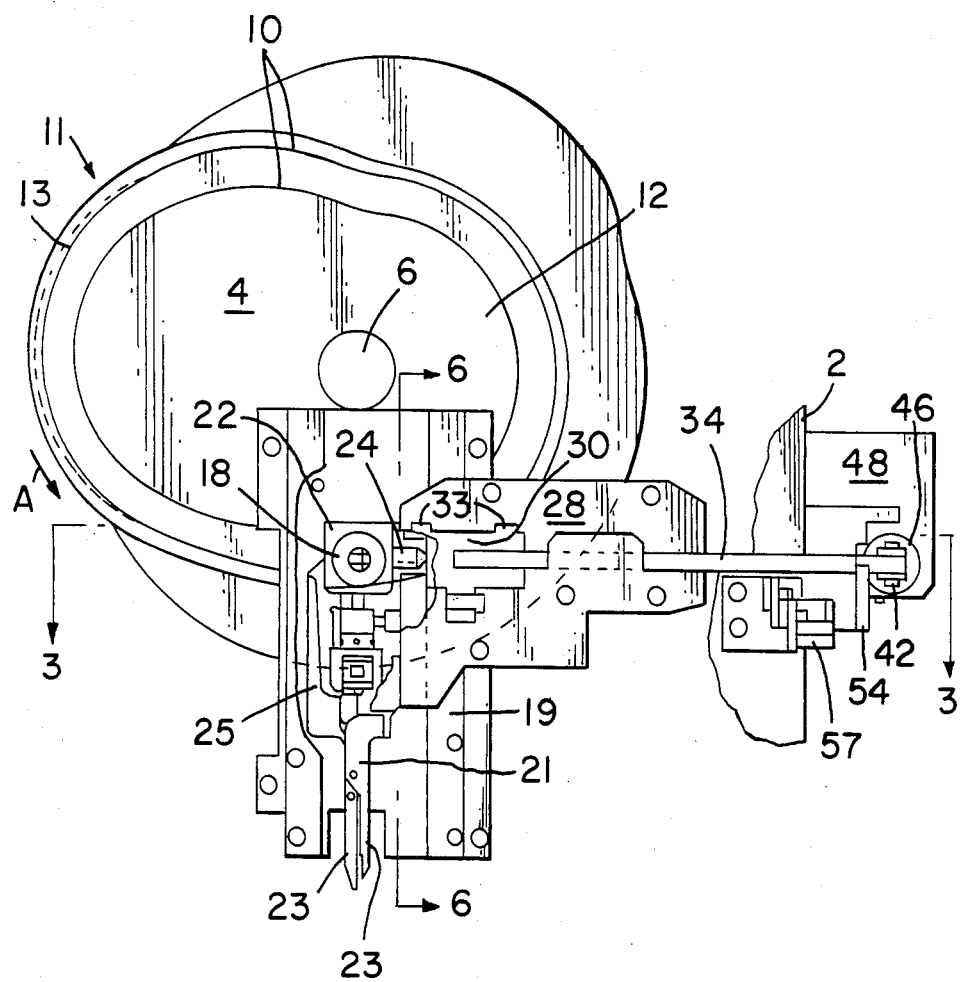
FIG. 2 is a fragmentary front of the apparatus view illustrating details of FIG. 1.
Figure 7:
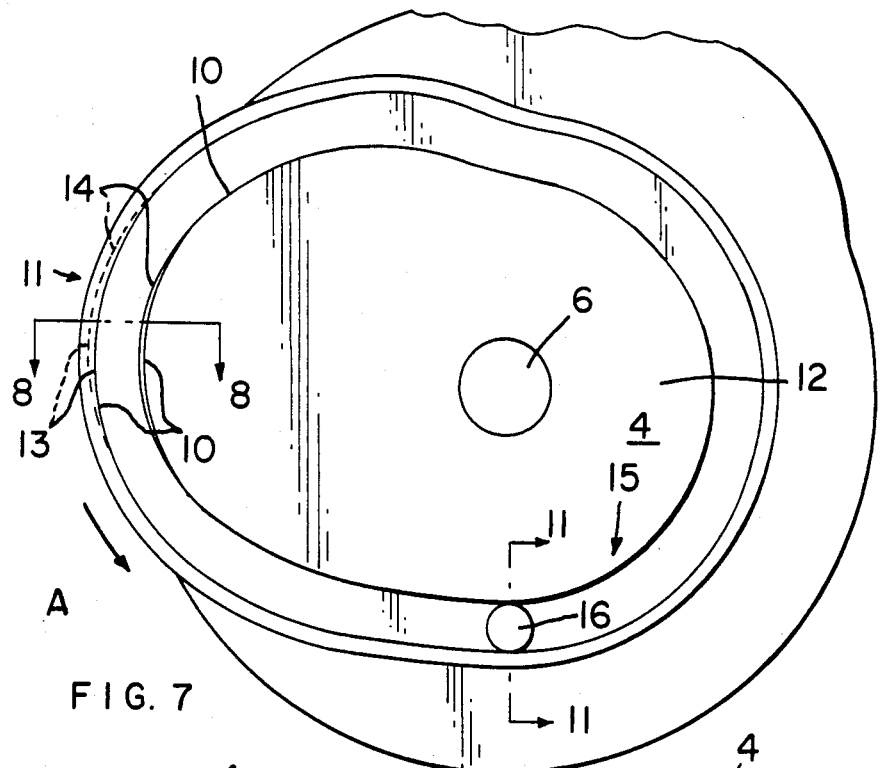
FIG. 7 is an enlarged view of a disc cam of the apparatus.
Figure 8:
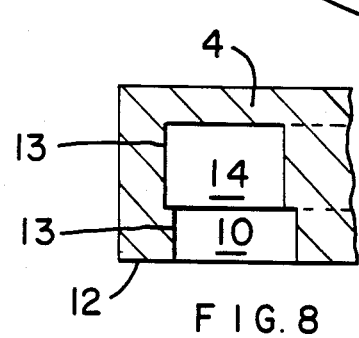
FIG. 8 is a view taken on the lines 8—8 of FIG. 7.
Figure 9:
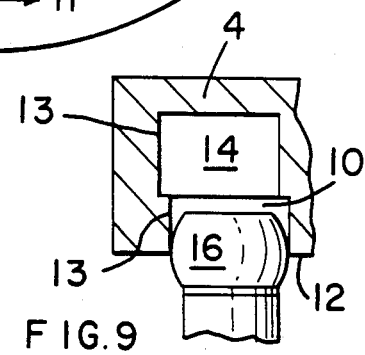
FIG. 9 is a similar view to that of FIG. 8 but showing a cam follower positioned in a cam track of the disc cam, according to said first mode of operation.

During each cycle of the apparatus the cam 4 is rotated through 360°, in the direction of the arrow A in FIGS. 1, 2 and 7 (in which Figures the cam 4 is shown in its rest position), thereby driving the tools 21 and 58 each through a working and a return stroke, the operation of the apparatus being controlled by a microprocessor (not shown). According to a first mode of operation of the apparatus, the piston and cylinder unit 46 is actuated, in the rest position of the cam 4, by way of a solenoid (not shown) according to the program of the microprocessor, so that its piston rod 44 is in a retracted position as shown in FIG. 3, whereby the slide 30 is in said first position, remote from the cam 4, so that the slot 32 is aligned with the channel 50 in the housing 28 and the slide 18 is in a retracted position remote from the cam 4 so that the cam follower roller 16 is engaged in the cam track 10, as shown in FIG. 9. The plate 54 is proximate to the sensor 57 which signals the microprocessor that the apparatus is set to operate in the first mode, that is to say to insert a first pin into the printed circuit board to the smaller depth.

As the cam 4 rotates, the crests 13 of the cam tracks 10 and 14 move into register with the cam follower roller 16 which is thereby driven down by its engagement with the cam track 10 so as to lower the tool 21 with a severed pin grasped between its jaws 23 to insert the pin into the appropriate hole in the printed circuit board to said smaller depth, in cooperation with underboard tooling (not shown) and which is described in U.S. Pat. No. 4,551,901. As the tool 21 is being driven down, the spigot 24 is driven by the downward movement of the tool holder 22 from the channel 32 in the slide 30 into the channel 50 in the housing 28, the spigot 24 moving downwardly therein until the tool 21 bottoms at the end of its working stroke. As the cam 4 further rotates, the tool 21 is raised through its return stroke, the spigot 24 rising in the groove 50 and reentering the groove 32 in the top dead center position of the tool 21, the cam follower roller 16 being then in a part of the cam track 10 where it is coincident with the cam track 14.

Figure 10:
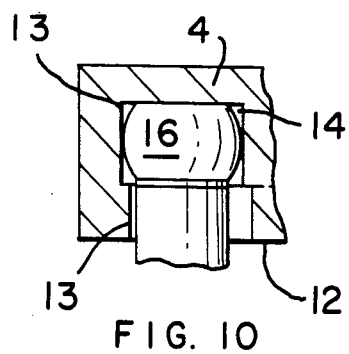
FIG. 10 is a similar view to that of FIG. 9, but showing the cam follower positioned according to said second mode of operation.

If, according to the program, the next pin is to be inserted to the greater depth, during the next following cycle of the apparatus, the microprocessor now actuates the piston and cylinder unit 46, in said rest position of the cam 4, by way of said solenoid, to advance its piston rod 44 to the position in which it is shown in FIG. 4, swinging the lever 34 so as to move the slide 30 towards the cam 4, thereby to drive the spigot 24 and thus the slide 18 in the same direction, so that the cam follower roller 16 is located in the cam track 14, as shown in FIG. 10, and the plate 54 is proximate to the sensor 57. The apparatus is accordingly set to operate in a second mode, and this condition of the apparatus is signalled to the microprocessor by the sensor 57. The cam 4 is then again rotated in the direction of the arrow A to drive the tool 21 through a further working stroke to insert said next pin. Since the cam track 14 is displaced radially outwardly of the cam track 10 at the crests 13, by the difference between the smaller and the greater insertion depths, said next pin is inserted into the circuit board to the greater depth. During said further working stroke of the tool 21, the spigot 24 is driven from the groove 32 in the slide 30 down the channel 52 of the housing 28 and is raised again into the groove 32 as the tool 21 returns to its top dead center position.

If the next following pin is to be inserted to the smaller depth, the microprocessor actuates the unit 46 to return its piston rod 44 to its retracted FIG. 3 position, to place the apparatus in its first operation mode.

Figure 11:
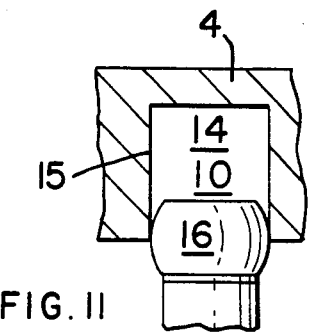
FIG. 11 is a view taken on the lines 11—11 of FIG. 7.

The piston and cylinder unit 46 is always actuated in said rest position of the cam 4, because the roller 16 is then in said remainder 15 of the length of the track 10 or 14, as the case may be, where said tracks are aligned (as best seen in FIG. 11) whereby the roller 16 can pass freely between the tracks 10 and 14.

We claim:

1. In apparatus for inserting a component into a workpiece, by means of an insertion tool driven there towards by a rotary cam having a first cam track receiving a cam follower connected to the tool, means for adjusting the depth to which the component is to be inserted into the workpiece, the insertion depth adjusting means comprising:

a second cam track formed in said cam at a deeper level therein than the first cam track and communicating therewith, the second cam track having a tool driving lobe which is displaced from a tool driving lobe of the first cam track radially of the axis of rotation of the cam; and a mechanism for selectively engaging said cam follower with said first or said second cam track to adjust the insertion depth of the workpiece to the extent of the displacement between said cam tracks at the crests of said lobes, said mechanism comprising a first slide carrying said cam follower and being mounted in a tool holder connected to said tool, for movement towards and away from said cam tracks, and drive means connected to said slide to move said cam follower from a first position in one of the cam tracks, to a second position in the other cam track.

2. Insertion depth adjusting means as claimed in claim 1, wherein said cam tracks are in alignment beyond said lobes.

3. Insertion depth adjusting means as claimed in claim 1, wherein a projection on said first slide extends into a groove in a second slide mounted in a housing fixed to a frame of the apparatus, for movement towards and away from said cam, said housing having first and second juxtaposed channels opening towards said first slide, for receiving said projection, one of said channels being in alignment with said groove when the cam follower is in the first cam track and the other channel being in alignment with said groove when the cam follower is in said second cam track, said drive means being connected to said second slide, for moving said second slide between a first position to place the cam follower in the first cam track and a second position to place the cam follower in the second cam track.

4. Insertion depth adjustment means as claimed in claim 3, further comprising a lever pivoted to said housing intermediate the ends of said lever, means pivotally connecting the second slide to one end of the lever, and a driving piston and cylinder unit having a piston rod pivotally attached to the other end of the lever, first and second sensors displaced from one another on said frame in the direction of movement of the lever, and means movable with the lever, to actuate the first sensor in the first position of said second slide and to actuate the second sensor in the second position of said second slide.

5. Apparatus for inserting a component into a workpiece, the apparatus comprising:
- a frame;
- a disc cam mounted for rotation in said frame about an axis of rotation;
- a first endless cam track formed in a first surface of said disc cam, and having a tool driving lobe;
- a second endless cam track formed in said first surface at a deeper level with respect thereto than said first cam track and communicating therewith, the second cam track having a tool driving lobe displaced from that of the first cam track radially of said axis of rotation;
- a cam follower engageable in each of said cam tracks;
- a tool holder slidably mounted in said frame and having a slideway extending in a direction parallel to said axis of rotation and being in alignment with said cam track;
- a cam follower slide in said slideway carrying said cam follower;
- a component insertion tool connected to said tool holder; and
- drive means for moving said slide towards and away from said cam, selectively to locate said cam follower in said first or said second cam track.

6. Apparatus as claimed in claim 5, wherein said cam tracks are in alignment excepting at said lobes.

7. Apparatus as claimed in claim 5, further comprising a housing fixed to said frame, a further slide slidable in said housing towards and away from said cam, said further slide having a groove receiving a spigot projecting from said cam follower slide, the housing having first and second parallel, juxtaposed, channels opening towards said cam follower slide and extending at right angles to said axis of rotation and beside said tool holder, said groove being in alignment with said first channel to allow said spigot to pass from said groove into said first channel in a first position of the cam follower slide and being aligned with the other channel in a second position of the cam follower slide, to allow said spigot to pass from said groove into said second channel, and a drive unit connected to said further slide for moving the cam follower slide between its first and its second positions.

8. Apparatus for inserting a component into a workpiece the apparatus comprising:
- a frame;
- a disc cam mounted for rotation in said frame about a horizontal axis, the cam having a forward face having first and second communicating, endless superposed cam tracks formed therein, the second cam track being disposed rearwardly of the first cam track, each cam track having a tool driving lobe, coextensively with which the cam tracks are mutually offset in a direction away from said axis of rotation, the cam tracks being otherwise in alignment;
- a tool holder slidably mounted in said frame of vertical reciprocating motion and carrying a component insertion tool;
- a cam follower mounted for horizontal sliding movement in said tool holder and engageable in each of said cam tracks so as to allow said tool holder to be driven in vertical reciprocating motion by the rotation of said cam; and
- means connected to said cam follower for driving it towards and away from said cam selectively to engage said cam follower in said first or said second cam track.

9. Apparatus as claimed in claim 8, wherein said tool holder has a slideway extending horizontally towards said cam tracks, said cam follower being mounted on a slide disposed in said slideway and being connected to said drive means for movement thereby from said first cam track into said second cam track and vice versa.

* * * * *